(12) United States Patent
Kim et al.

(10) Patent No.: US 6,879,190 B2
(45) Date of Patent: Apr. 12, 2005

(54) LOW-POWER DRIVER WITH ENERGY RECOVERY

(75) Inventors: Joohee Kim, Ann Arbor, MI (US); Marios C. Papaefthymiou, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 10/406,367

(22) Filed: Apr. 3, 2003

(65) Prior Publication Data

US 2003/0201803 A1 Oct. 30, 2003

Related U.S. Application Data

(60) Provisional application No. 60/370,091, filed on Apr. 4, 2002.

(51) Int. Cl.[7] ................................................ H03B 1/00
(52) U.S. Cl. ...................... 327/108; 327/111; 327/376; 327/377; 327/404
(58) Field of Search .................... 327/108–112, 184, 327/365, 374, 376, 377, 379, 387, 388, 403, 404; 326/17, 21, 23, 24; 365/189.01

(56) References Cited

U.S. PATENT DOCUMENTS

| | | | | |
|---|---|---|---|---|
| 4,611,135 A | * | 9/1986 | Nakayama et al. | 327/391 |
| 5,111,072 A | * | 5/1992 | Seidel | 327/94 |
| 5,332,916 A | * | 7/1994 | Hirai | 257/369 |
| 5,430,408 A | * | 7/1995 | Ovens et al. | 327/404 |
| 5,473,526 A | | 12/1995 | Svensson et al. | 363/60 |
| 5,489,866 A | * | 2/1996 | Diba | 327/206 |
| 5,506,520 A | | 4/1996 | Frank et al. | |
| 5,506,528 A | * | 4/1996 | Cao et al. | 327/108 |
| 5,517,145 A | | 5/1996 | Frank | |
| 5,526,319 A | | 6/1996 | Dennard et al. | |
| 5,537,067 A | * | 7/1996 | Carvajal et al. | 327/108 |
| 5,559,478 A | | 9/1996 | Athas et al. | |
| 5,760,620 A | * | 6/1998 | Doluca | 327/112 |
| 5,838,203 A | | 11/1998 | Stamoulis et al. | |
| 5,892,387 A | * | 4/1999 | Shigehara et al. | 327/537 |
| 5,896,054 A | * | 4/1999 | Gonzalez | 327/268 |
| 6,052,019 A | * | 4/2000 | Kwong | 327/437 |
| 6,091,629 A | * | 7/2000 | Osada et al. | 365/156 |
| 6,160,422 A | * | 12/2000 | Huang | 326/95 |
| 6,169,443 B1 | * | 1/2001 | Shigehara et al. | 327/534 |
| 6,177,819 B1 | * | 1/2001 | Nguyen | 327/112 |
| RE37,552 E | | 2/2002 | Svensson et al. | |

OTHER PUBLICATIONS

Low–Power Digital Systems Based on Adiabatic–Switching Principles by William C. Athas, Lars "J." Svensson, Member IEEE, Jeffrey G. Koller, Nestoras Tzartzanis, and Eric Ying–Chin Chou, Student Member, IEEE in the IEEE Transaction On Very Large Scale Integration (VLSI) Systems, vol. 2, No. 4, Dec. 1994, (pp. 398–407).

A Resonant Clock Generator for Single–Phase Adiabatic Systems by Conrad H. Ziesler, Suhwan Kim and Marios C. Papaefthymiou. P)ublished ISLPED '01, Aug. 6–7, 2001, (p. 159–164).

Energy Recovering Static Memory by Joohee Kim, Conrad H. Ziesler & Marios C. Papaefthymiou. Published ISLPED '02, Aug. 12–14, 2002.

* cited by examiner

*Primary Examiner*—Timothy P. Callahan
*Assistant Examiner*—Hai L. Nguyen
(74) *Attorney, Agent, or Firm*—Rader, Fishman & Grauer PLLC

(57) ABSTRACT

The present invention provides an energy recovering driver that includes a pull-up control, a pull-down control and a transmission gate. The pull up control is responsive to a pull-up control signal and a clock signal to turn the transmission gate ON and OFF and predetermined positions of the clock signal. The pull-down control is responsive to a pull-down control signal and the clock signal to turn the transmission gate ON and OFF at other predetermined locations of the clock signal. The transmission gate transmits the clock signal when at an ON condition and does not transmit the clock signal when in an OFF condition.

34 Claims, 7 Drawing Sheets

US 6,879,190 B2

LOW-POWER DRIVER WITH ENERGY RECOVERY

CROSS-REFERENCE TO RELATED APPLICATIONS

This application claims priority based on U.S. Provisional Patent Application No. 60/370,091, filed Apr. 4, 2002, the entirety of which is incorporated herein by reference.

This invention was made with government support under Grant #DAAD19-99-1-0304 by U.S. Department of the Army. The government has certain rights in the invention.

FIELD OF THE INVENTION

The present invention generally relates to a low power driver, and more particularly, the present invention relates to a low power driver with energy recovery characteristics.

BACKGROUND OF THE INVENTION

Conventional SRAM architecture is used for on-chip quick memory access, such as with cache memories. Bit line drivers drive bit lines and word line drivers drive word lines connected to cells in the SRAM to read and write information from and to memory cells in the SRAM. When effectuating a read in such a system, a word line is energized to allow the bit lines access to connected memory cells. A pair of bit lines is pre-charged before energizing the word line. Subsequently, a voltage across the pair of bit lines, representative of the stored value, is read by a sense amplifier to effectuate the read operation. A latching circuit latches the amplified voltage and holds it available for devices to read. The word line is again charged to allow access to the desired cell in the array. Here, one bit line is charged while the other is not to effectuate the write to a cell.

In such architectures, managing power dissipation has become an increasingly important goal. To this end, some computing systems have begun to use recovery or adiabatic clock circuits to recycle the clock signal pulse that is sent across the bit lines and word lines, via the bit line drivers and the word line drivers, in an attempt to reduce power consumption. While this does effectuate energy savings, some drawbacks currently exist with the present state of this technology. Specifically, such systems are commonly complex and yield clock signal waveforms that either fail to provide energy recovery characteristics, such as an abrupt or square wave, or fail to provide needed switching capabilities. The present invention was developed in light of these and other drawbacks.

BRIEF SUMMARY OF THE INVENTION

The present invention provides an energy recovering driver that includes a pull-up control, a pull-down control and a transmission gate. The pull up control is responsive to a pull-up control signal and a clock signal to turn the transmission gate ON and OFF at predetermined positions on a cyclical clock signal. The pull-down control is responsive to a pull-down control signal and the clock signal to turn the transmission gate ON and OFF at other predetermined locations on the cyclical clock signal. The transmission gate transmits the clock signal when in an ON condition and does not transmit the clock signal when in an OFF condition. Other aspects of the invention will be apparent to those skilled in the art after reviewing the drawings and the detailed description below.

BRIEF DESCRIPTION OF THE DRAWINGS

The present invention will now be described, by way of example, with reference to the accompanying drawings, in which.

DETAILED DESCRIPTION OF THE INVENTION

It is to be understood that the present invention may be embodied in other specific forms without departing from its essential characteristics. The illustrated and described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

Figure 1:
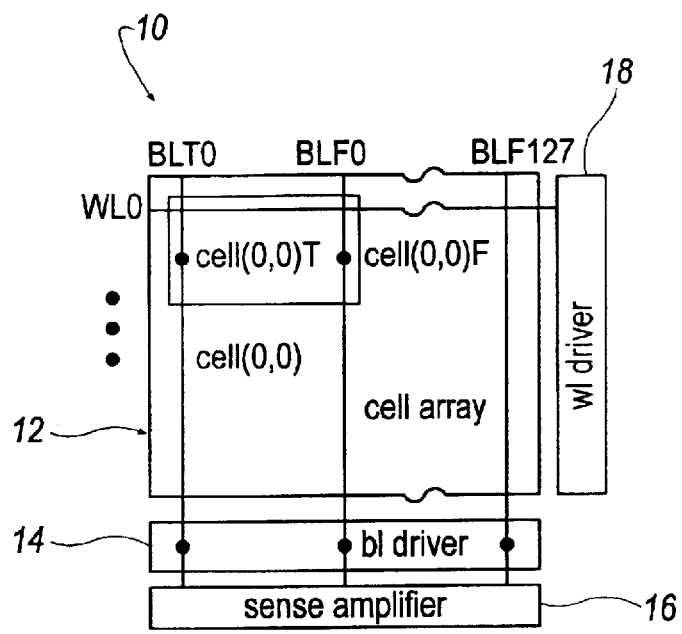
FIG. 1 is a schematic view of one aspect of an SRAM architecture according to the present invention.

Referring now to FIG. 1, a SRAM architecture 10 according to the present invention is shown and described. SRAM architecture 10 generally includes cell array 12 having a plurality of memory cells, bit line driver 14 that drives a plurality of bit lines, sense amplifier 16, and word line driver 18 that drives a plurality of word lines. The word line driver 18 activates or deactivates specific memory cells in the cell array 12 via energization of respective word lines, such that bit line driver 14 can effectuate read or write operations to or from any of the cells therein via respective bit lines. Sense amplifier 16 amplifies the read value on the bit lines and outputs the value to requesting external devices.

Figure 2:
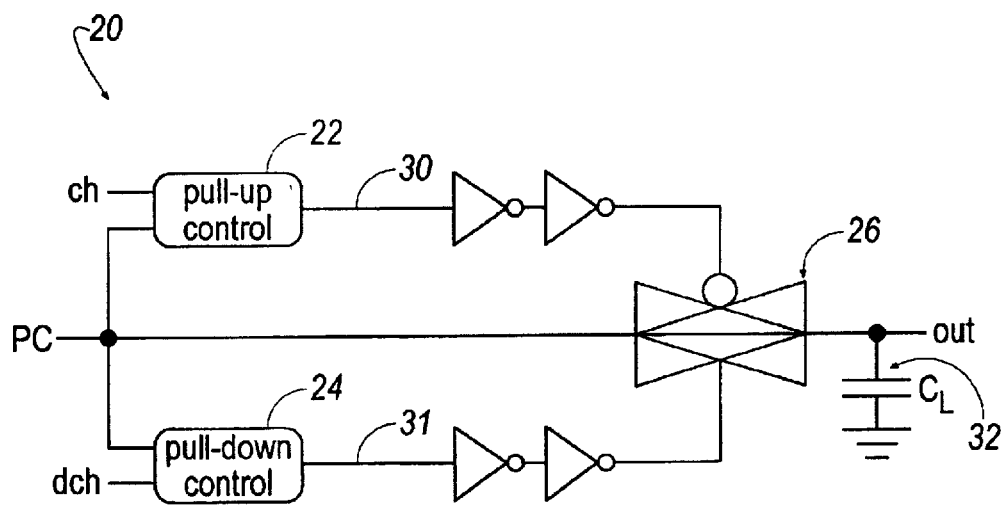
FIG. 2 is a schematic view of an energy recovering driver according to an aspect of the present invention.

Referring now to FIG. 2, an energy recovering driver 20 is shown and described. Energy recovering driver 20 can be used for bit line driver 14 or word line driver 18 in FIG. 1. The energy recovering driver generates a desired wave form along the respective word line or bit line to effectuate the operations as described above. To accomplish its desired features, energy recovering driver 20 generally includes pull-up control 22, pull-down control 24 and transmission gate 26. Pull-up control 22 receives pull-up control signal ch and clock signal PC. Pull-down control 24 receives pull-down control signal dch as well as clock signal PC. Transmission gate 26 includes a PMOS transistor connected to the output of the pull-up control 22 and an NMOS transistor connected to the pull-down control 24. Of course, other arrangements are possible besides those described herein.

The clock signal PC is a cyclical signal generated from a clock signal generator, and preferably is a sinusoidal or ramped clock signal. Control signals ch and dch respectively activate the pull-up control and pull-down control to turn the transmission gate 26 ON and OFF in conjunction with the clock signal PC. Pull-up control 22 outputs a zero voltage to the PMOS portion of transmission gate 26 to turn the transmission gate 26 ON and allow clock signal PC to be output to the driven load 32, which may be the bit lines BLT (bit line true), BLF (bit line false) or the word lines WL of cell array 12. Likewise, pull-down control 24 generates a positive voltage to the gate of NMOS transistor portion of transmission gate 26 to turn the transmission gate 26 ON to allow the clock signal PC to be output to the driven load 32. Similar to pull-up control 22, pull-down control 24 is dependent on clock signal PC and pull-down control signal dch.

Figures 3A, 3B, 3C:
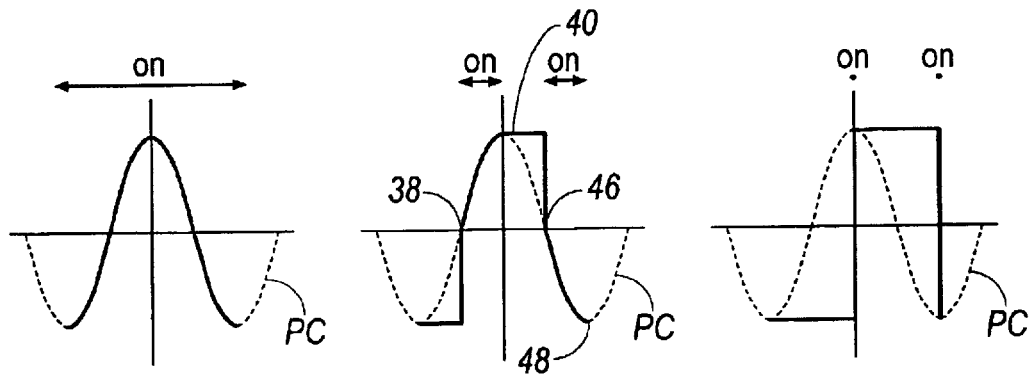
FIG. 3A is a graphic view of a wave form according to an aspect of the present invention.
FIG. 3B is a graphic view of a wave form according to an aspect of the present invention.
FIG. 3C is a graphic view of a wave form according to the present invention.

Referring now to FIGS. 3A–3C, the output to load 32 is described in greater detail. FIG. 3A illustrates a situation of maximum energy recovery. Here, the sinusoidal wave transmitted to WL or BLT, BLF provide maximum energy recovery features. The driver output results when the transmission gate 26 is turned ON for the entire power clock signal PC, allowing the output to track the gradually changing power clock wave form. This approach yields high energy efficiency, since driver output changes smoothly throughout. It, however, results in the lowest operating frequency due to the short stay of the driver output at the peak value. In FIG. 3C, the output of transmission gate 26 is turned ON only at positive and negative peaks of the power clock signal PC. This yields maximum speed, since the driver output stays at its peak value for about half the clock cycle. It also results in the lowest energy efficiency due to the abruptness of the output transmissions. FIG. 3B provides an example of a preferred wave form according to the present invention. In FIG. 3B, partial gradual transitions are used to result in both high efficiency and high speed. Another advantage of this output wave form is that the driver output does not need to be pulled down to the $V_{ss}$ after each operation. Therefore, energy is not dissipated during consecutive operations of the same kind.

Figure 4A:
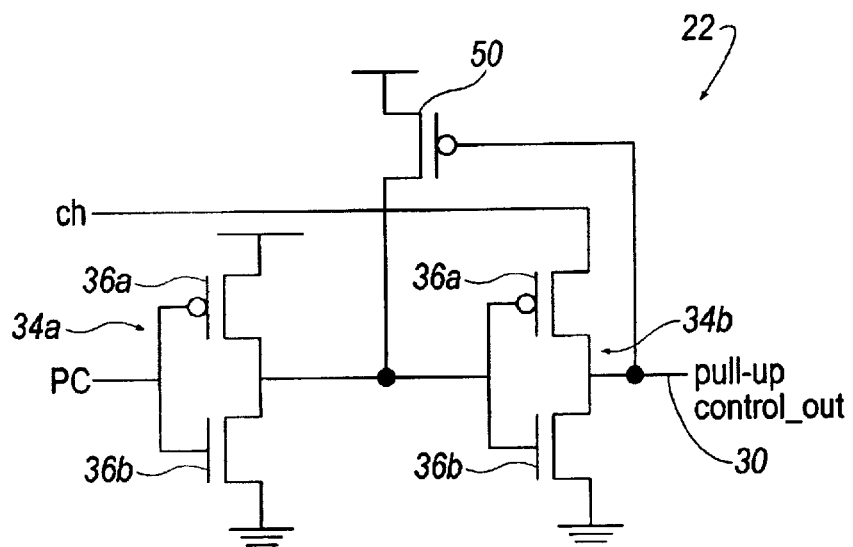
FIG. 4A is a schematic view of an aspect of a pull-up control according to the present invention.
Figure 4B:
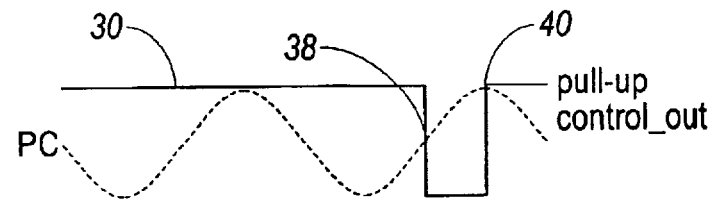
FIG. 4B is a graphical view of the operation of the pull-up control according to the present invention.

Referring now to FIGS. 4A and 4B, an embodiment of pull-up control 22 is described that, in conjunction with the later described pull-down control, results in the desired wave form of FIG. 3B. In FIG. 4A, pull-up control 22 includes invertor 34a and inverter 34b. Each inverter 34a and 34b includes complimentary PMOS and NMOS transistors 36a and 36b respectively. In operation, invertor 34a and 34b are tuned to stop control signal ch from passing to the pull-up control out or output 30 when clock signal PC reaches mid-point 38 (See FIG. 3B). This zero voltage is supplied to the PMOS transistor of transmission gate 26 to turn transmission gate 26 ON and allow clock signal PC to be provided to driven load 32 such as bit lines BLT or BLF or word line WL. This effectively pulls the output 30 up to the current clock value and continues with a sloped clock signal. When clock signal PC reaches peak value 40, invertors 34a and 34b allow control signal ch to be provided to pull-up control out or output 30 to turn the PMOS transistor of transmission gate 26 OFF. This, in turn, prohibits the clock signal PC from being provided to output load 32. Due to the parasitic capacitance in the output load, such as in bit lines BLT, BLF or word lines WL, depending what the driver is being used for, the system voltage remains at the peak value until the pull down control 24 is turned ON, as will be described in greater detail. With reference to FIG. 4B, the pull-up control out or output 30 is shown in connection with clock signal PC. As can be seen, pull up control out or output 30 is turned OFF when midpoint 38 is reached and then turned back ON when peak value 40 is reached.

Figure 5A:
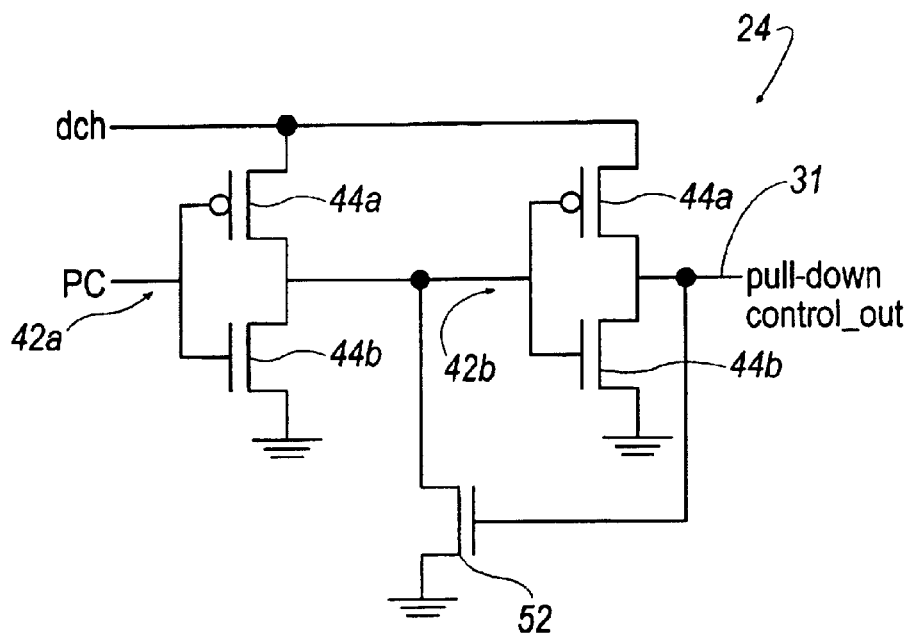
FIG. 5A is a schematic view of a pull-down control according to the present invention.
Figure 5B:
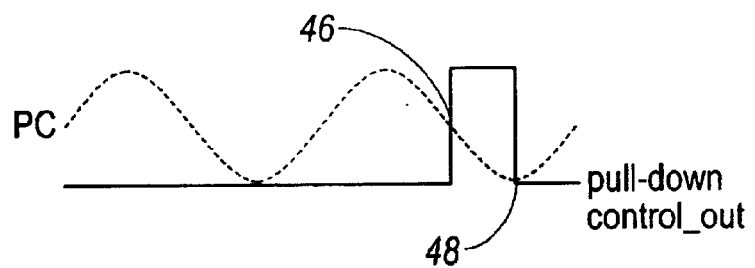
FIG. 5B is a graphical view of the operation of a pull-down control according to the present invention.

Referring now to FIGS. 5A and 5B, the pull-down control 24 is described in greater detail. Pull-down control 24 includes invertors 42A and 42B which each have complimentary PMOS and NMOS transistors 44A and 44B respectively. Like before, invertors 42A and 42B are tuned such that, as shown in FIG. 5B, pull-down control out or output 31 is turned ON to allow control signal dch to be provided to the gate of the NMOS transistor of transmission gate 26 when downward midpoint 46 of clock signal PC is reached. Likewise, invertors 42A and 42B are tuned such that control signal dch is not provided through PMOS transistor 44A and to pull-down control out or output 31 when peak minimum value 48 is reached. As such, between points 46 and 48, transmission gate 26 is ON to allow the sloped power clock signal PC to be provided to output load 32. Once the peak minimum value 48 is reached, then invertors 42A and 42B stop providing control signal dch to pull down control out or output 31. As such, the parasitic capacitance of the system maintains the system voltage at this minimum peak value.

As will be further noted, pull-up control signal ch and pull-down control dch can be provided to pull up control 22 and pull-down control 24 respectively to selectively turn transmission gate 26 ON and OFF depending on the read or write operations being conducted with the cell array 12.

The control circuitry of FIGS. 4 and 5 are similar to Schmidt triggers which return sharp transmissions from slow power clock transitions. The transition point with respect to the power clock and the pulse width can be controlled by ratioing the transistors of the first invertors 34a and 42A and the stand alone PMOS 50 or NMOS 52 in a way similar to CMOS Schmidt triggers. The control signal ch and dch selectively enable the control circuitry to minimize idle power dissipation. This structure ensures correct operation of the SRAM architecture 10 for a broad range of supply voltages and operating frequencies.

Figure 6:
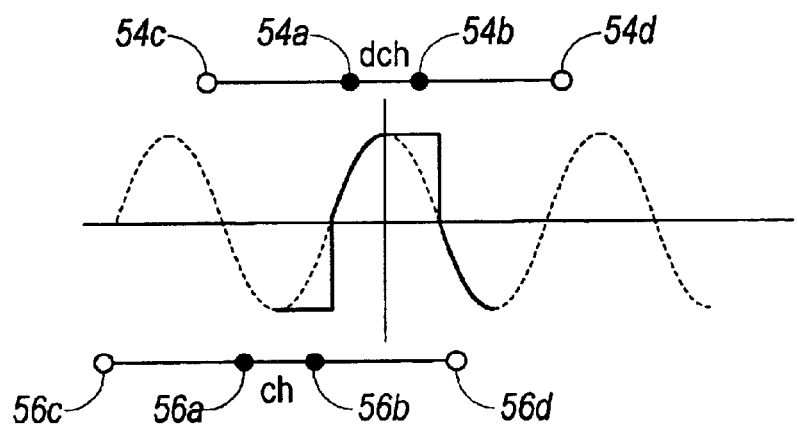
FIG. 6 is a graphical view of an output of an energy recovering driver according to the present invention.

As the supply voltage changes, the delay through different paths changes nonlinearly causing variance in timing of the control signals. Since the PMOS and NMOS control signals of transmission gate 26 must stay in synchrony with the clock signal PC despite changes in the supply voltage, the control signal must be tolerant to the variance in the timing of the driver control signals. As shown in FIG. 6, the timing of the driver control signal ch and dch for correct driver operation are illustrated. Due to the construction of the circuitry in FIGS. 4A and 5A, the control signal dch ideally is maintained between points 54A and 54B while control signal ch is maintained between preferably 56A and 56B. This allows a wide latitude for providing the control signals for proper operation of the pull-out control 22 and pull-down control 24. Additionally, control signals dch and ch can be operated even up to points 54C and 54D for dch and 56C and 56D for ch.

Figure 7:
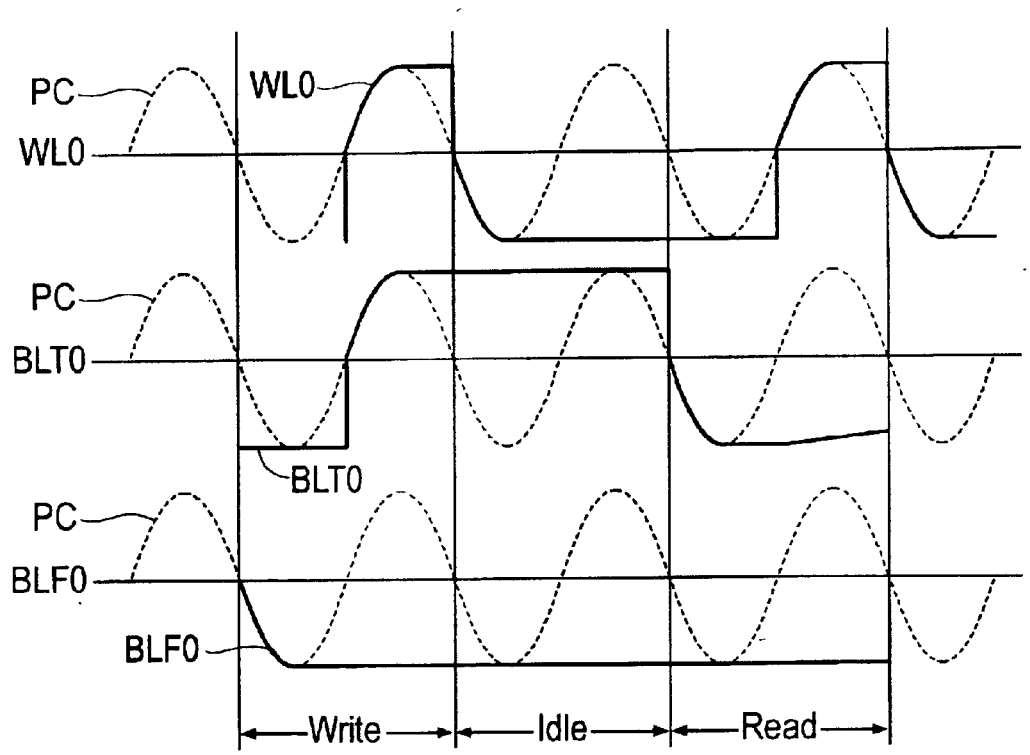
FIG. 7 is a graphical view of read and write operations of an SRAM architecture according to the present invention.

Referring now to FIG. 7, application of energy recovering drivers 20 as bit line driver 14 and word line driver 18 respectively and the operation thereof is described. In the SRAM architecture according to the present invention, the clock signal PC is preferably a single phase clock signal. Write operations occur in a manner similar to conventional SRAMs. First, bit line BLF0 storing "0" is pulled down. Then, both the word line WL0 and the bit line BLT0 storing "1" are pulled up storing data into one of the cells of cell array 12.

For every memory access, only one selected word line is pulled up, and all other word lines are pulled down. In conventional SRAMs, pulling down the unselected word line is not dissipative, since the $V_{ss}$ level is always available. In the SRAM architecture 10 according to the present invention, however, this operation dissipates power. Since the pull down starts when the clock signal PC is above $V_{ss}$, the word lines are actually pulled up above $V_{ss}$ and then pulled down. Hence, in the energy recovering SRAM according to the present invention, the selected word line is preferably pulled down explicitly after each access.

In read operations, since pre-charge must precede the assertion of a word line, all bit line pairs must be pre-charged low for the read to occur in a single cycle. In FIG. 7, BLT0 and BLF0 are set low before WL0 is set high. After precharge, the word line WL is charged and the cell nodes of a cell in cell array 12 cause a voltage difference between each pair of bit lines BL. Pre-charging low is more energy efficient than precharging high in the present invention, since the charge pumped from the cell to the bit line BL can be recovered through the bit line driver 14. Preferably, the sense amplifier 16 is modified to make it more sensitive for the voltage difference near $V_{ss}$ as opposed to $V_{dd}$.

Figure 8:
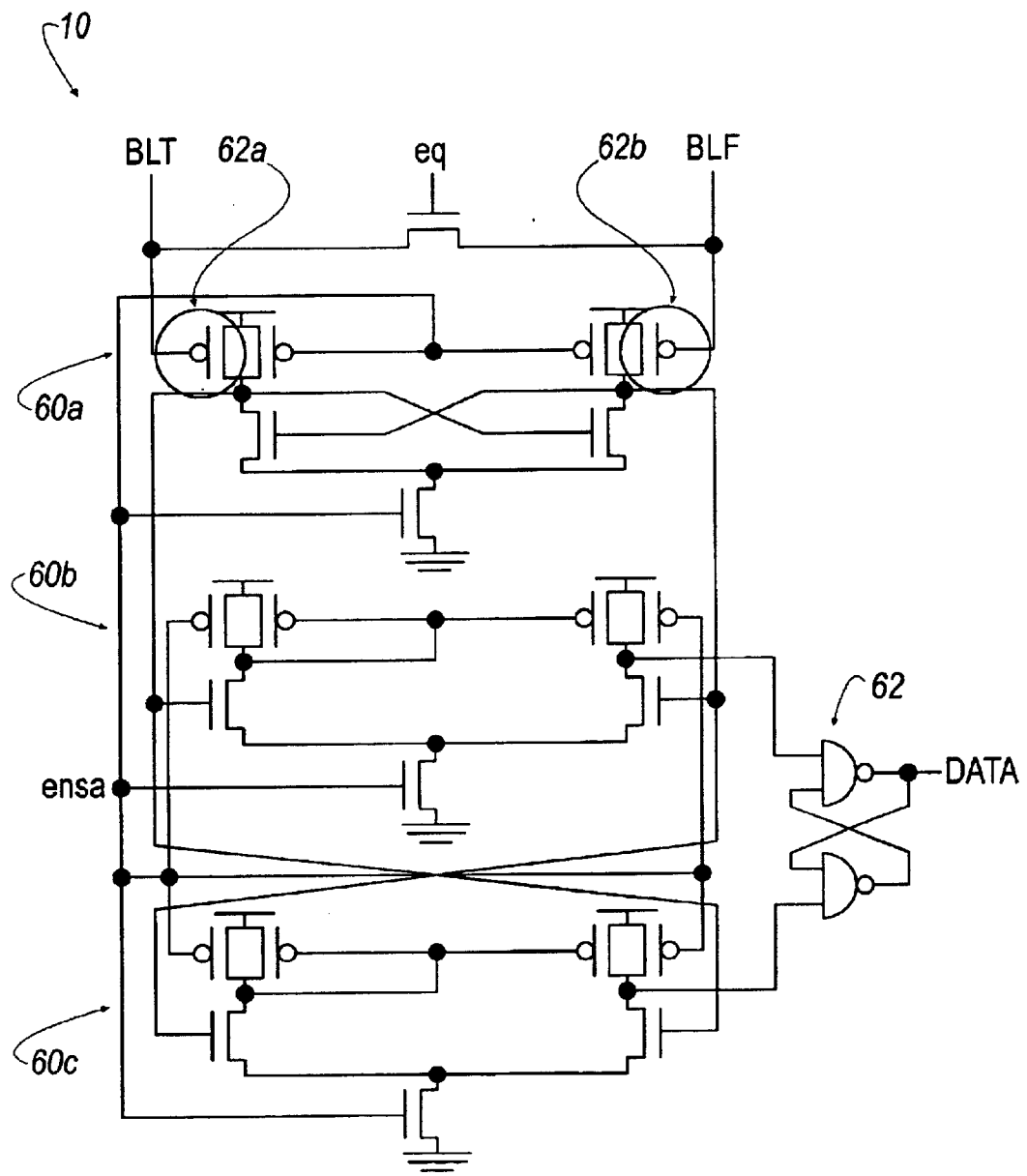
FIG. 8 is a schematic view of a sense amplifier according to an aspect of the present invention.

With reference to FIG. 8, the sense amplifier 16 is shown that provides the increased sensitivity for sensing voltage differences near $V_{ss}$ as opposed to $V_{dd}$. Specifically, in FIG. 8, sense amplifier 16 is shown including three stacked amplifiers 60a, 60b and 60c. Amplifier 60a is preferably a cross-coupled sense amplifier while amplifier 60b and 60c are preferably current mirror amplifiers. Of course, it is understood that many different arrangements can be provided for sense amplifier 16 and the present invention is not limited to that disclosed herein. In FIG. 8, cross coupled sense amplifier 60a includes PMOS transistors 62A and 62B which have gates connected to bit line BLT and bit line BLF of FIG. 7. The voltages of BLT and BLF, approaching $V_{ss}$ during read operations, operate the PMOS transistors to allow amplifier 60a, 60b and 60c to amplify the voltage difference between BLT and BLF. Latch circuit 63 latches this amplified voltage difference and outputs it for respective read operations.

Figure 12:
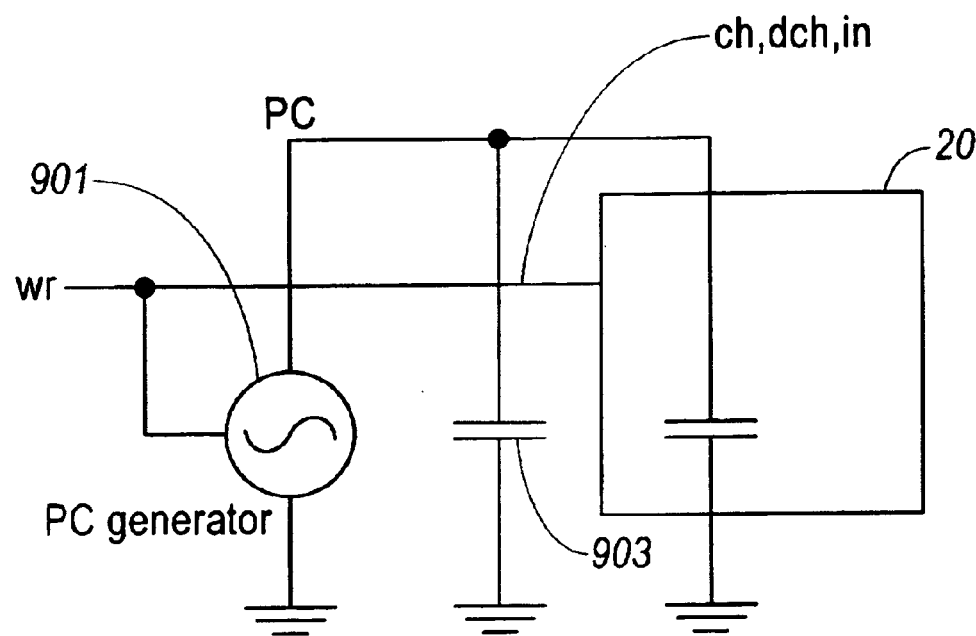
FIG. 12 is a schematic view of an energy recovery memory with power clock generator according to the present invention.

The energy recovering driver 20 according to the embodiments of the invention are preferably used in conjunction with a energy recovering power clock. With reference to FIG. 12, energy recovering power clock 901 is shown in conjunction with energy recovering driver 20 and storage device 903. The storage device can be a SRAM, DRAM, NVM or display device. Such an energy recovering power clock 901 can be according to co-pending patent application entitled CLOCK SIGNAL GENERATING CIRCUIT, assigned to the assignee of the present invention and hereby incorporated by reference. The storage device supplies the clock signal PC to the driver 20, without supplementation by power clock 901 until such a point that the signal needs additional energy. Control signal wr can be any control signal described herein including ch, dch or in, or any combination therefrom, for instructing the power clock 901 to supplement additional energy to the system as well as providing control signals to the driver 20.

Figure 9:
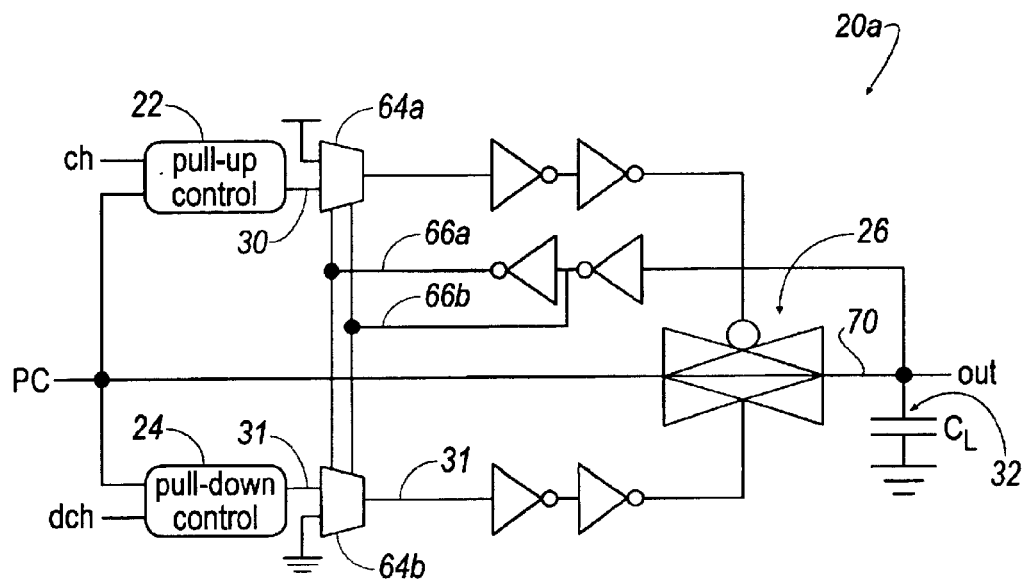
FIG. 9 is a schematic view of an energy recovering driver according to the present invention.

Referring now to FIG. 9, another embodiment of the energy recovering driver is shown and described. In FIG. 9, an energy recovering driver 20a is shown which includes generally pull-up control 22, pull-down control 24 and the transmission gate 26 as described in the previous embodiments. As before, the pull-up control 22, the pull-down control 24 and transmission gate 26 operate to generate a clock wave form as shown in FIG. 3B. However, in addition to these components, energy recovering driver 20a also includes multiplexers 64a and 64b as well as feedback lines 66a and 66b. In a present embodiment, the energy recovering driver 20a generates an output that stays at peak value for longer periods of time, making it suitable for high speed SRAM applications. Moreover, the energy recovering driver 20a does not switch its load unnecessarily during consecutive operations of the same kind, since its output does not need to be pulled down after each operation. Specifically, when the output 70 of energy recovering driver 20a is high and the pull up control 22 issues an output 30 to turn the transmission gate 26 ON, the multiplexer receives feedback via feedback line 66a and, based on this feedback, the multiplexer does not allow output 30 to turn transmission gate 26 ON. Therefore, the transmission gate does not pass the clock signal to the output. Likewise, when output 70 is low, transmission line 66b passes this value to multiplexer 64b. As such, if output 31 of pull down control 24 is outputting a voltage to turn transmission gate 26 ON, then the multiplexer 64b does not allow this output 31 to pass to the transmission gate 26.

Figure 10:
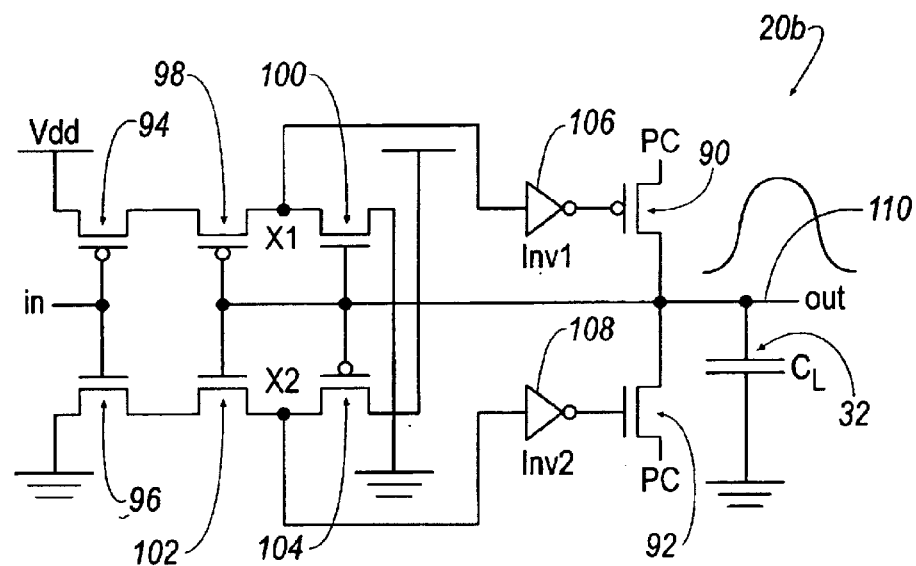
FIG. 10 is a schematic view of an energy recovering driver according to the present invention.

Referring now to FIG. 10, another embodiment of the energy recovering driver according to the present invention is shown and described. In FIG. 10, energy recovering driver 20b includes a pair of low driving pass transistors 90 and 92, two evaluation transistors 94 and 96, two pairs of driver activation blocks controlled by feedback from the driver output (PMOS transistor 98, NMOS transistor 100, NMOS transistor 102, PMOS transistor 104), and a pair of invertors 106 and 108 that drive the low driving pass transistors 90 and 92.

The activation block, including transistors 98, 100, 102 and 104, allow the energy recovering driver 20b output to track the clock signal PC while preventing unnecessary switching. Since the energy recovering driver 20b is powered by an oscillating power clock, the output of the driver also oscillates even when the driver input remains unchanged. This prevents idle switching and increases driver efficiency.

Energy recovering driver 20b has two modes of operation depending on the level of the output of energy recovering driver 20b. If out 110 and clock signal PC are low, the transistor 90 is turned ON to charge the driver output 110. Since transistor 100 is turned OFF, and transistor 98 is turned ON, assuming input IN is low, a pull up path is formed from $V_{dd}$ to X1. Thus, through invertor 106, transistor 90 is turned ON to charge the load in an energy recovery manner. As clock signal PC and out 110 reaches full rail, transistor 98 is turned OFF and transistor 100 is turned ON pulling down X1 to Gnd, thereby turning transistor 90 OFF. If out 110 is at high level, transistor 90 remains turned OFF regardless of IN to prevent unnecessary swing of driver output. Since transistor 98 is turned OFF and transistor 100 is turned ON, X1 is clamped down causing transistor 90 to remain turned OFF.

The driver discharge path is a dual of the driver charge path and has two modes of operation depending on the level of the driver output 110. If out 110 and clock signal PC is high, transistor 92 is turned ON to discharge the driver 20b until clock signal PC and out 110 reaches its lowest peak value, assuming IN is high. If out 110 is low, transistor 92 remains turned OFF regardless of IN, preventing unnecessary dissipation.

The output of the drivers, which is generally governed by overdriving transistor 90 and transistor 92 with additional voltage levels supplied into invertors 106 and 108 respectively achieves more efficient switching by providing full gradual swing of both transistors 90 and 92 at each peak of the power clock wave form PC.

Figure 11:
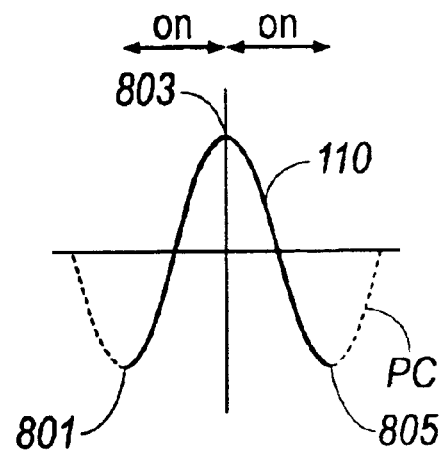
FIG. 11 is a graphic view of a waveform according to the present invention.

Referring to FIG. 11, the timing of the energy recovery driver 20*b* is shown and described. In FIG. 11, transistor 90 is turned ON at position 801 to pull the output 110 up in a fashion following the sinusoidal clock signal PC. Likewise, transistor 92 is turned OFF. Next, at position 803, when output 110 reaches its peak, transistor 90 is turned OFF and transistor 92 is turned ON. This begins to pull the output 110 down with the clock signal PC. Then, when the output 110 reaches its minimum at 805, transistor 92 is turned OFF and transistor 90 is turned ON to repeat the cycle.

It should be noted that although the driver described in the present invention is described with use for an SRAM device, it can also be used for driving DRAM, busses, NVM (non-volatile memories), displays such as flat panel displays, or any other device in need of a driver.

While the present invention has been particularly shown and described with reference to the foregoing preferred and alternative embodiments, it should be understood by those skilled in the art that various alternatives to the embodiments of the invention described herein may be employed in practicing the invention without departing from the spirit and scope of the invention as defined in the following claims. It is intended that the following claims define the scope of the invention and that the method and apparatus within the scope of these claims and their equivalents be covered thereby. This description of the invention should be understood to include all novel and non-obvious combinations of elements described herein, and claims may be presented in this or a later application to any novel and non-obvious combination of these elements. The foregoing embodiments are illustrative, and no single feature or element is essential to all possible combinations that may be claimed in this or a later application. Where the claims recite "a" or "a first" element of the equivalent thereof, such claims should be understood to include incorporation of one or more such elements, neither requiring nor excluding two or more such elements.

What is claimed is:

1. An energy recovery driver comprising:
   a pull-up control that receives a pull-up control signal and a sinusoidal clock signal.
   a pull-down control that receives a pull-down control signal and the sinusoidal clock signal;
   a transmission gate that transmits the sinusoidal clock signal when in an ON condition and that does not transmit the sinusoidal clock signal when in an OFF condition;
   wherein the pull-up control is responsive to the pull-up control signal and the clock signal to turn the transmission gate ON at a first pull-up position on the clock signal and to turn OFF the transmission gate at a second pull-up position on the clock signal;
   wherein the pull-down control is responsive to the pull-down control signal and the clock signal to turn ON the transmission gate at a first pull down position on the clock signal and to turn OFF the transmission gate at a second pull-down position on the clock signal.

2. The energy recovery driver according to claim 1, wherein:
   the first pull-up position on the clock signal is a mid-point of the clock signal on an increasing slope of the clock signal; and
   the second pull-up position on the clock signal is at a maximum peak on the clock signal.

3. The energy recovery driver according to claim 2, wherein:
   the first pull-down position on the clock signal is at a mid-point of the clock signal and a decreasing slope of the clock signal; and
   the second pull-down position on the clock signal is at a minimum value of the clock signal.

4. The energy recovery driver according to claim 1, wherein the pull-up control comprises:
   a first invertor having a first PMOS transistor and a first NMOS transistor connecting a voltage source to ground;
   a second invertor having a second PMOS transistor and a second NMOS transistor connecting the pull-up control signal to ground; and
   a third PMOS transistor connecting a voltage source to gates of the second PMOS transistor and second NMOS transistor;
   wherein the clock signal drives gates of the first PMOS transistor and the first NMOS transistor;
   wherein a connection point between a drain of the first PMOS transistor and a source of the first NMOS transistor is connected to the gates of the second PMOS transistor and the second NMOS transistor;
   wherein a connection point between a drain of the second PMOS transistor and a source the second NMOS transistor drives a PMOS portion of the transmission gate; and
   wherein the second connection point is connected to a gate of the third PMOS transistor.

5. The energy recovery driver according to claim 4, wherein the first invertor and the second invertor are tuned to turn the transmission gate ON at the first pull-up position and tuned to turn the transmission gates OFF at the second pull-up position.

6. The energy recovery driver according to claim 1, wherein the pull-down control comprises:
   a first invertor having a first PMOS transistor and a first NMOS transistor in series that connects the pull-down control signal to ground;
   a second invertor having a second PMOS transistor and a second NMOS transistor that connects the pull-down control to around;
   a third NMOS transistor connecting gates of the second PMOS transistor and the second NMOS transistor to ground;
   wherein the clock signal drives gates of the first PMOS transistor and the first NMOS transistor;
   wherein a first connection between a drain of the first PMOS transistor and a source of the first NMOS transistor is connected to the piles of the second PMOS transistor and the second NMOS transistor;
   wherein a second connection point between the drain of the second PMOS transistor and a source of the second NMOS transistor connects to a gate of the third NMOS transistor; and
   wherein the second connection point drives a gate of an NMOS portion of the transmission gate.

7. The energy recovery driver according to claim 6, wherein the first inventor and the second inventor are tuned to turn the transmission gate ON at the first pull-down position of the clock signal and to turn the transmission gate OFF at the second pull-down position of the clock signal.

8. The energy recovery driver according to claim 1, wherein an output of the transmission gate drives at least a bit line or a word line or an SRAM memory architecture.

9. The energy recovery driver according to claim 1, further comprising:
a pull up feedback loop connected to the pull up control;
a pull-down feedback loop connected to the pull-down control;
wherein the pull-up feedback loop prohibits the pull up control from turning the transmission gate ON when an output of the transmission gate is at or above a current voltage level of the clock signal.

10. The energy recovery driver according to claim 9, further comprising:
the pull-down feedback loop connecting an output of the transmission gate to the pull-down control;
wherein the pull-down feedback loop prohibits the pull-down control from turning the transmission gate ON when the output of the transmission gate is at or below a current clock signal value.

11. The energy recovery driver according to claim 1, wherein:
the first pull-up position is a minimum value of the clock signal; and
the second pull-up position is a peak value of the clock signal.

12. The energy recovery driver according to claim 11, wherein:
the first pull down position is a peak value of the clock signal; and
the second pull down position is a minimum value of the clock signal.

13. The energy recovery driver according to claim 12, wherein the transmission gate comprises:
a transmission PMOS transistor connecting the clock signal to an output; and
a transmission NMOS transistor connecting the output to the clock signal;
wherein a gate of the transmission PMOS transistor is connected to the pull up control; and
wherein a gate of the NMOS transistor is connected to the pull down control.

14. The energy recovery driver according to claim 13, wherein the pull up control comprises:
a first PMOS transistor, a second PMOS transistor and a third NMOS transistor positioned in series and connecting a voltage source to ground;
wherein a connection point between a drain of the second PMOS transistor and a source of the third NMOS transistor connects to a gate of the transmission PMOS transistor through an invertor;
wherein the pull up control signal is connected to a gate of the first PMOS transistor; and
wherein the output is connected to gates of the second PMOS transistor and the third NMOS transistor.

15. The energy recovery driver according to claim 14, wherein the pull-down control further comprises:
a fourth NMOS transistor, a fifth NMOS transistor, and a sixth PMOS transistor in series and connecting ground to a voltage source;
wherein the pull-up control signal and the pull-down control signal are a same signal;
wherein the same signal is connected to a gate of the fourth NMOS transistor;
wherein a connection point between a source of the fifth NMOS transistor and a drain of the sixth PMOS transistor is connected to a gate of the NMOS transmission transistor through an inverter;
where the output is connected to gates fifth NMOS transistor and sixth PMOS transistor.

16. The energy recovery driver according to claim 1, wherein the pull-up control signal and the pull-down control signal are a same signal.

17. The energy recovery driver according to claim 1, wherein the pull-up control signal and the pull-down control signal are different signals.

18. A method for driving a device, the method comprising:
supplying an energy recovering driver with a ramped or sinusoidal clock signal;
driving the device with the ramped or sinusoidal clock signal when the clock signal reaches a first pull-up position;
ceasing to drive the driver with the clock signal when the clock signal reaches a second pull-up position;
wherein a parasitic capacitance in the driver maintains a voltage of the driver at the second pull-up position after the step-up ceasing.

19. The method according to claim 18, wherein the device, is an SRAM, DRAM, NVM, bus or flat panel display.

20. A method for driving a word line or a bit line of an SRAM architecture the method comprising:
supplying an energy recovering driver with a ramped or sinusoidal clock signal;
driving the word line or bit line with the ramped or sinusoidal clock signal when the clock signal reaches a first pull-up position;
ceasing to drive the word line or bit line with the clock signal when the clock signal reaches a second pull-up position;
wherein a parasitic capacitance in the word line or bit line maintains a voltage of the word line or bit line at the second pull-up position after the step-up ceasing.

21. The method according to claim 20, further comprising:
feeding back voltage information from the word line or bit line to a driver that performs the driving step; and
selectively allowing or disallowing the driver to drive the word line or bit line in response to the feed back step.

22. The method according to claim 21, wherein the selectively allowing or disallowing step disallows the driver to drive the word line or bit line when the voltage information shows a voltage of the word line or bit line as being greater than or equal to a current voltage of the power clock.

23. The method according to claim 21, wherein the selectively allowing or disallowing step allows the driver to drive the word line or bit line when the voltage information shows a voltage of the word line or bit line as being less than or equal to a current voltage of the power clock.

24. The method according to claim 20 wherein:
the bit line comprises a bit line true and a bit line false; and further comprising the steps of pre-charging the bit line true and the bit line false to a low value; and
charging the word line to a high value after the bit line true and the bit line false are pre-charged to read a logic state or a cell in the SRAM.

25. The method according to claim 24, further comprising the step of:
coupling a sense amplifier to the bit line true and the bit line false;
wherein the sense amplifier is adapted to read a voltage difference between the bit line true and the bit line false to determine the logic state of the cell.

26. The method according to claim 25, wherein coupling the sense amplifier further comprises:
coupling gates of a set of PMOS transistors to the bit line true and the bit line false respectively.

27. The method according to claim 20, further comprising the step of:
generating the clock signal with an energy recovering power clock.

28. The method according to claim 27, wherein generating the clock signal with an energy recovering power clock comprises;
selectively supplementing energy to the clock signal when the clock signal falls below a predetermined point;
maintaining the clock signal by transferring energy back and forth from the power clock to memory.

29. The method according to claim 28, wherein generating the clock signal with an energy recovering power clock comprises generating a single phase clock signal.

30. The method according to claim 20, wherein:
connecting a control signal
to the power clock to selectively replenish the power clock; and
the control signal is adapted to cause the driving step.

31. The method according to claim 20, wherein:
the bit line comprises a bit line true and a bit line false;
pre-charging the bit line true and the bit line false to a high value;
charging the word line to a high value after the bit line true and the bit line false are pre-charged to read a logic state of a cell in the SRAM.

32. A method for driving a word line or a bit line of an SRAM architecture, the method comprising;
supplying an energy recovering driver with a ramped or sinusoidal clock signal;
driving the word line or bit line with the ramped or sinusoidal clock signal when the clock signal reaches a first pull-up position;
ceasing to drive the word line or bit line with the clock signal when the clock signal reaches a second pull-down position;
wherein a parasitic capacitance in the word line or bit line maintains a voltage of the word line or bit line at the second pull-up position after the step-up ceasing;
driving the word line or bit line with the clock signal when the clock signal reaches a first pull-down position; and
ceasing driving the word line or bit line with the clock signal when the clock signal reaches a second pull-down position.

33. The method according to claim 32, wherein:
the first pull-up position is at a mid-point on an increasing slope of the clock signal;
a second pull-up position is at a peak value of the clock signal;
the first pull-down position is at a mid-point on a decreasing slope of the clock signal; and
the second pull-down position is at a minimum value of the clock signal.

34. The method according to claim 32, wherein the first pull-up position is at a minimum value of the clock signal;
the second pull-up position is at a peak value of the clock signal;
the first pull down position is at a peak value of the clock signal; and
the second pull-down value is at a minimum value of the clock signal.

* * * * *